(12) United States Patent
Koli et al.

(10) Patent No.: US 9,299,584 B2
(45) Date of Patent: Mar. 29, 2016

(54) METHODS OF FORMING INTEGRATED CIRCUITS WITH A PLANARIZED PERMANENT LAYER AND METHODS FOR FORMING FINFET DEVICES WITH A PLANARIZED PERMANENT LAYER

(71) Applicant: GLOBALFOUNDRIES, Inc., Grand Cayman (KY)

(72) Inventors: Dinesh Koli, Clifton Park, NY (US); Deepasree Konduparthi, Clifton Park, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/314,595

(22) Filed: Jun. 25, 2014

(65) Prior Publication Data

US 2015/0380269 A1    Dec. 31, 2015

(51) Int. Cl.
| | |
|---|---|
| *H01L 21/4763* | (2006.01) |
| *H01L 21/321* | (2006.01) |
| *H01L 21/3105* | (2006.01) |
| *H01L 27/088* | (2006.01) |

(52) U.S. Cl.
CPC ...... *H01L 21/3212* (2013.01); *H01L 21/31053* (2013.01); *H01L 27/0886* (2013.01)

(58) Field of Classification Search
CPC ............ H01L 21/4763; H01L 21/7684; H01L 21/76819; H01L 21/31053; H01L 21/76877
USPC ............................ 438/626, 631, 692; 257/618
See application file for complete search history.

(56) References Cited

U.S. PATENT DOCUMENTS

| | | | |
|---|---|---|---|
| 6,350,693 B2 | 2/2002 | Chang et al. | |
| 2002/0168834 A1* | 11/2002 | Chen et al. | 438/427 |
| 2009/0087475 A1* | 4/2009 | Sheehan | 424/443 |
| 2013/0236782 A1* | 9/2013 | Ozaki et al. | 429/211 |
| 2014/0242797 A1* | 8/2014 | Adam et al. | 438/692 |

* cited by examiner

*Primary Examiner* — Phuc Dang
(74) *Attorney, Agent, or Firm* — Ingrassia Fisher & Lorenz, P.C.

(57) ABSTRACT

Devices and methods of forming an integrated circuit and a FinFET device with a planarized permanent layer are provided. In an embodiment, a method of forming a planarized permanent layer includes providing a base substrate that has an uneven surface topography. A permanent layer is conformally formed over the base substrate. The permanent layer includes raised portions and sunken portions that correspond to the surface topography of the base substrate. A sacrificial layer is conformally formed over the permanent layer. The sacrificial layer and the raised portions of the permanent layer are chemical-mechanical planarized to provide the planarized permanent layer. The sacrificial layer is substantially completely removed after chemical-mechanical planarizing.

19 Claims, 2 Drawing Sheets

METHODS OF FORMING INTEGRATED CIRCUITS WITH A PLANARIZED PERMANENT LAYER AND METHODS FOR FORMING FINFET DEVICES WITH A PLANARIZED PERMANENT LAYER

TECHNICAL FIELD

The technical field generally relates to devices that have a planarized permanent layer, methods of forming integrated circuits having a planarized permanent layer, and methods of forming devices such as FinFETs that include the planarized permanent layer. More particularly, the technical field relates to methods of forming integrated circuits and devices such as FinFETs with a planarized permanent layer having minimized variation in surface topography after planarizing.

BACKGROUND

The majority of present day integrated circuits (ICs) are implemented by using a plurality of interconnected field effect transistors (FETs), also called metal oxide semiconductor field effect transistors (MOSFETs or MOS transistors). A MOS transistor includes a gate electrode as a control electrode overlying a semiconductor substrate and spaced-apart source and drain regions in the substrate between which a current can flow. A gate insulator is disposed between the gate electrode and the semiconductor substrate to electrically isolate the gate electrode from the substrate. A control voltage applied to the gate electrode controls the flow of current through a channel in the substrate underlying the gate electrode between the source and drain regions. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the transistor size decreases.

A Fin field-effect transistor (FinFET) is a type of transistor that lends itself to the dual goals of reducing transistor size while maintaining transistor performance. The FinFET is a three dimensional transistor formed in a thin fin that extends upwardly from a semiconductor substrate with a gate electrode structure disposed over and around the fin. Transistor performance, often measured by its transconductance, is proportional to the width of the transistor channel. In a FinFET the transistor channel is formed along the vertical sidewalls of the fin or on both vertical sidewalls and the top horizontal plane of the fin, so a wide channel, and hence high performance, can be achieved without substantially increasing the area of the substrate surface required by the transistor.

Transistor performance is also impacted by surface topography of the gate electrode structure. During formation of the gate electrode structure, a gate dielectric layer and a gate electrode layer are formed over the fins and over the semiconductor substrate outside of the fins to form a gate electrode structure, resulting in a stepped configuration with raised portions of the gate electrode structure over the fins and sunken portions over the semiconductor substrate outside of the fins. Planarity between the raised portions and the sunken portions is generally desired for optimal transistor performance, with various techniques such as chemical-mechanical planarization (CMP) or partial CMP and reactive ion etching (RIE) employed to planarize the raised portions. However, existing techniques are ineffective to planarize the raised portions without introducing variations in surface planarity because the techniques rely upon removing a fixed amount of material, and different pattern densities result in different heights of raised portions in areas of different pattern densities after planarizing. Variations in surface planarity also generally increase as more material is removed due to the differences in pattern density. As a result, it is difficult to reduce variation in surface topography below 500 Å.

Accordingly, it is desirable to provide methods of forming integrated circuits with a planarized layer, methods of forming devices such as FinFETs that include the planarized layer, and devices that include a planarized layer with minimized variations in surface planarity. Furthermore, other desirable features and characteristics of the present invention will become apparent from the subsequent detailed description of the invention and the appended claims, taken in conjunction with the accompanying drawings and this background of the invention.

BRIEF SUMMARY

Methods of forming integrated circuits and FinFET devices with a planarized permanent layer, and devices having a planarized permanent layer are provided. In an embodiment, a method of forming an integrated circuit with a planarized permanent layer includes providing a base substrate that has an uneven surface topography. A permanent layer is conformally formed over the base substrate. The permanent layer includes raised portions and sunken portions that correspond to the surface topography of the base substrate. A sacrificial layer is conformally formed over the permanent layer. The sacrificial layer and the raised portions of the permanent layer are chemical-mechanical planarized to provide the planarized permanent layer. The sacrificial layer is substantially completely removed after chemical-mechanical planarizing.

In another embodiment, a method of forming a FinFET device includes providing a base substrate that includes fins. The fins include semiconductor material. A gate electrode structure is conformally formed over the base substrate and the fins. The gate electrode structure includes raised portions that are disposed over the fins and sunken portions that are disposed over the base substrate outside of the fins. A sacrificial layer is conformally formed over the gate electrode structure. The sacrificial layer has a different chemical-mechanical planarization rate than the gate electrode structure. The sacrificial layer and the raised portions of the gate electrode structure are chemical-mechanical planarized onto substantially even plane with the sunken portions of the gate electrode structure to form a planarized gate electrode structure.

In another embodiment, a device includes a base substrate that has an uneven surface topography. A planarized permanent layer is conformally disposed over the base substrate and has a lower boundary that corresponds to the surface topography of the base substrate and a planarized upper boundary on an opposite side of the permanent layer from the lower boundary. The planarized upper boundary has a variation in surface topography of less than or equal to about 500 Å.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

Methods of forming integrated circuits with a planarized permanent layer, methods of forming devices such as Fin-FETs that include the planarized permanent layer, and devices that include a planarized permanent layer with minimized variations in surface planarity are provided herein. The minimized variations in surface planarity are achieved by conformally forming a sacrificial layer over the permanent layer, followed by chemical-mechanical planarizing (CMP) the sacrificial layer and raised portions of the permanent layer. As used herein, "permanent layers" refer to layers in which at least a portion thereof remains in the final devices and/or integrated circuits. For example, the permanent layer may be an interlayer dielectric layer, a gate electrode structure, an interconnect, or any other layer that remains in the final device and/or integrated circuit and that is planarized during fabrication. As also used herein, "sacrificial layer" refers to a layer that is conformally formed over the permanent layer and that is substantially completely removed by CMP. By "substantially completely removed", it is meant that CMP in accordance with the methods described herein theoretically removes all of the sacrificial layer, with no portion of the sacrificial layer remaining after CMP (although it is to be appreciated that trace amounts of the sacrificial layer may remain in accordance with actual processing conditions). Due to the presence of the sacrificial layer, planarization of surface contours begins during CMP of the sacrificial layer. Further, because the sacrificial layer is present while the raised portions of the permanent layer are subject to CMP, removal of the raised portions can occur while sunken portions of the permanent layer are shielded from CMP. As a result, within-wafer (WIW) non-uniformity (i.e., variation in surface planarity) is minimized and variations in surface planarity of less than or equal to about 500 Å is possible, and variations in surface planarity of less than or equal to about 100 Å may even be possible.

Figure 1:
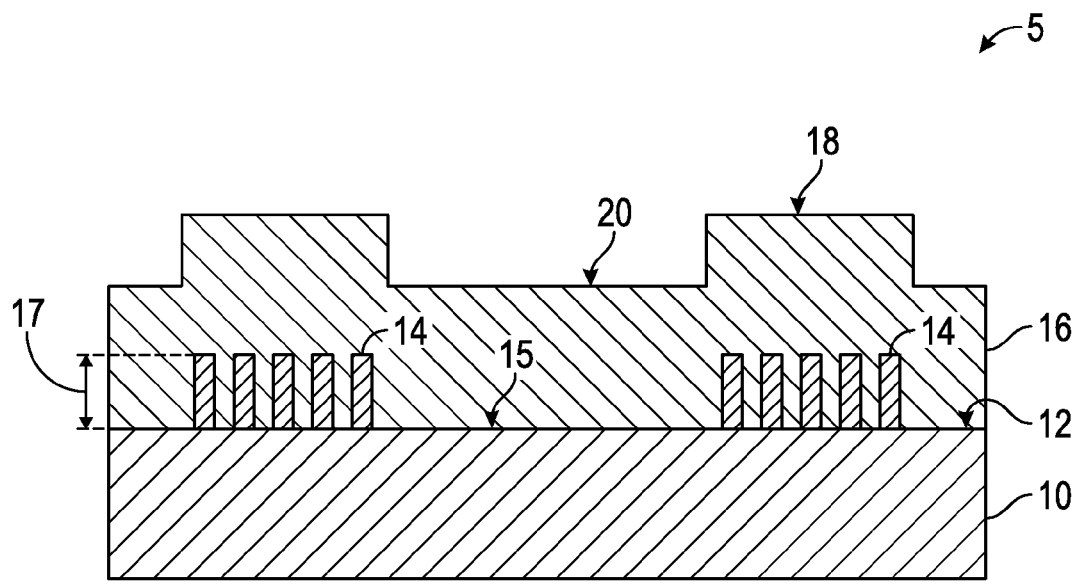
FIGS. 1-4 are cross-sectional side views of a method of forming an integrated circuit with a planarized permanent layer over a base substrate that includes fins in accordance with an exemplary embodiment.

An exemplary method of forming an integrated circuit with a planarized permanent layer will now be described with reference to FIGS. 1-4. In this embodiment, the permanent layer includes a gate electrode structure that is formed over fins, and the gate electrode structure is formed in accordance with FinFET fabrication. However, it is to be appreciated that the methods described herein are suitable for planarizing any permanent layer where minimized variation in surface planarity is desired. Referring to FIG. 1, in accordance with an exemplary embodiment, a base substrate 10 of an integrated circuit 5 is provided that has an uneven surface topography, i.e., a surface 12 of the base substrate 10 either has a rough topography or has features protruding therefrom. In embodiments, the surface 12 of the base substrate 10 exhibit a variation in surface planarity, i.e., a difference in height between thickest and thinnest portions of the base substrate 10 of greater than about 500 Å as measured from the surface 12 of the base substrate 10, although variation in surface planarity is often substantially greater than 500 Å. In an embodiment, the base substrate includes fins 14 that provide the uneven surface topography. The fins 14 include semiconductor material. Without intending to be limiting, the fins 14 may have a width on the nanometer scale, such as from about 10 to about 30 nm, although the devices and methods described herein are not limited to any particular dimensional constraints. The fins 14 may also have a height 17 on the nanometer scale, such as from about 15 to about 50 nm. As used herein, "semiconductor materials" include monocrystalline silicon materials, such as relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In the embodiment shown in FIG. 1, the base substrate 10 is a bulk silicon wafer with the fins 14 formed in the bulk silicon wafer. However, it is to be appreciated that in other embodiments and although not shown in the Figures, the base substrate 10 may include a silicon-containing material that is disposed on an insulating material, commonly known as a silicon-on-insulator (SOI) structure that, in turn, may be supported by a support substrate. For illustrative purposes, only a portion of the base substrate 10 is shown in FIG. 1.

As also shown in FIG. 1, a permanent layer 16 is conformally formed over the base substrate 10. By "conformally formed", it is meant that the permanent layer 16 is formed to match surface contours of the base substrate. The permanent layer 16 has a lower boundary 15 that corresponds to the surface topography of the base substrate 10. Due to the uneven surface topography of the base substrate 10, the permanent layer 16 includes raised portions 18 and sunken portions 20 that correspond to the surface topography of the base substrate 10. In particular, in the embodiment shown in FIG. 1, the permanent layer 16 is conformally formed over the fins 14 and outside of the fins 14, resulting in the raised portions 18 disposed over the fins and the sunken portions 20 disposed over the base substrate 10 outside of the fins 14. In this embodiment, the permanent layer 16 is a gate electrode structure 16 that will become part of a FinFET device. Although the permanent layer 16 is only shown as a single layer, it is to be appreciated that the permanent layer 16 may include multiple layers of different materials. For example, the gate electrode structure 16 may include a conformally-formed gate dielectric layer (not separately shown) that is disposed over the base substrate 10 and the fins and a conformally-formed gate electrode (not separately shown) over the gate dielectric layer in accordance with conventional gate electrode structure formation. The gate dielectric layer may include a conventional dielectric material (such as a silicon oxide) and the gate electrode layer may include one or more layers including a semiconductor material.

Figure 2:
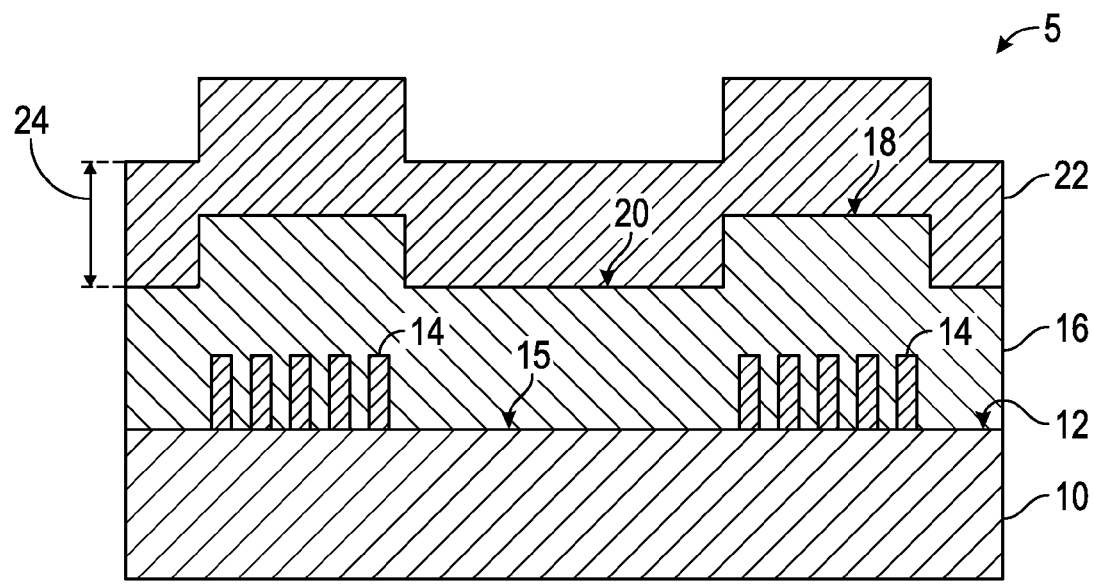

Referring to FIG. 2, a sacrificial layer 22 is conformally formed over the permanent layer 16. As alluded to above, it is intended that the sacrificial layer 22 be substantially completely removed by CMP. In this regard, the sacrificial layer 22 is only provided to enable effective surface planarization of the permanent layer 16 with minimized variation in surface planarity, and the sacrificial layer 22 has no functional role within the final device. Particular materials for the sacrificial layer 22 depend upon material of the permanent layer 16 over which the sacrificial layer 22 is conformally disposed, with the sacrificial layer 22 having a different chemical-mechanical planarization rate than the permanent layer 16. Further, particular materials for the sacrificial layer 22 also depend upon distribution of raised portions 18 and sunken portions 20 of the permanent layer 16, which correspond to relative surface area of the raised portions 18 to the sacrificial layer 22 upon exposing the raised portions 18 during CMP. In particular, when the permanent layer 16 has raised portions 18 that have a higher pattern density than the sunken portions 20, the raised portions will have a greater relative surface area as compared to the sacrificial layer 22 upon exposing the raised portions 18 during CMP. Under such circumstances, the sacrificial layer 22 may have a higher chemical-mechanical planarization rate than the permanent layer 16 with a particular etching platen and slurry used because CMP of the permanent layer 16 will control a rate at which thickness of the raised portions 18 is decreased. In this embodiment, the permanent layer 16 may include semiconductor material such as silicon, suitable materials for the sacrificial layer 22 may include, but are not limited to, silicon oxide, and a conventional ceria-based slurry may be employed for CMP. In another embodiment, when the permanent layer 16 has raised portions 18 that have a lower pattern density than the sunken portions 20, the raised portions 18 will have a lower relative surface area as compared to the sacrificial layer 22 upon exposing the raised portions 18 during CMP. Under such circumstances, the sacrificial layer 22 may have a lower chemical-mechanical planarization rate than the permanent layer 16 with a particular etching platen and slurry used because CMP of the sacrificial layer 22 will control a rate at which thickness of the raised portions 18 is decreased. In this embodiment, the permanent layer 16 may include semiconductor material such as silicon, suitable materials for the sacrificial layer 22 may include, but are not limited to, an oxide, a nitride, or spin on glass, and ceria slurry may be employed for CMP.

Referring to FIG. 2, the sacrificial layer may be conformally formed to have a thickness 24 that is equal to or greater than a difference in height between the sunken portions 20 and the raised portions 18 of the permanent layer 18. In this regard, with the sacrificial layer 22 being conformally formed over the permanent layer, the portions of the sacrificial layer 22 that overlie the sunken portions 20 of the permanent layer will provide a continuous surface during CMP even once portions of the sacrificial layer 22 that overlie the raised portions 18 of the permanent layer 16 are removed.

Figure 3:
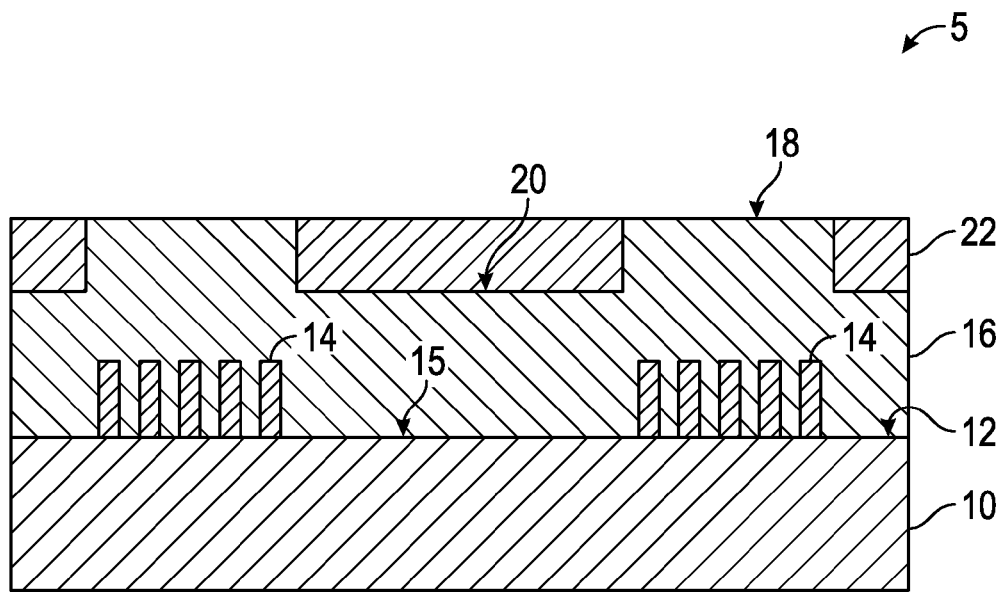

CMP may then be conducted using an appropriate platen and slurry. Planarization of surface contours attributable to the fins 14 begins during initial CMP of the sacrificial layer 22, where portions of the sacrificial layer 22 that overlie the raised portions 18 of the permanent layer are first removed. Referring to FIG. 3, planarizing of the sacrificial layer 22 may proceed until surfaces of the raised portions 18 of the permanent layer 16 are exposed. Once the raised portions 18 are exposed, CMP may proceed using an appropriate platen and slurry based upon the constraints as set forth above depending upon pattern density of the raised portions 18. In an embodiment, the same platen and slurry are employed to initially planarize the sacrificial layer 22 and to further planarize the sacrificial layer 22 and the raised portions 18 once the raised portions are exposed. In another embodiment, a first platen and slurry are used for initially planarizing the sacrificial layer 22 and a second platen and/or slurry that are different from the first platen and slurry are used to further planarize the sacrificial layer 22 and the raised portions 18 once the raised portions are exposed depending upon whether selectivity for removal of the raised portions 18 over the sacrificial layer 22 is desired. In either embodiment, the presence of the sacrificial layer 22 while the raised portions 18 are planarized minimizes variation in surface planarity by protecting the underlying sunken portions 20 of the permanent layer 16 while the raised portions 18 are planarized.

Figure 4:
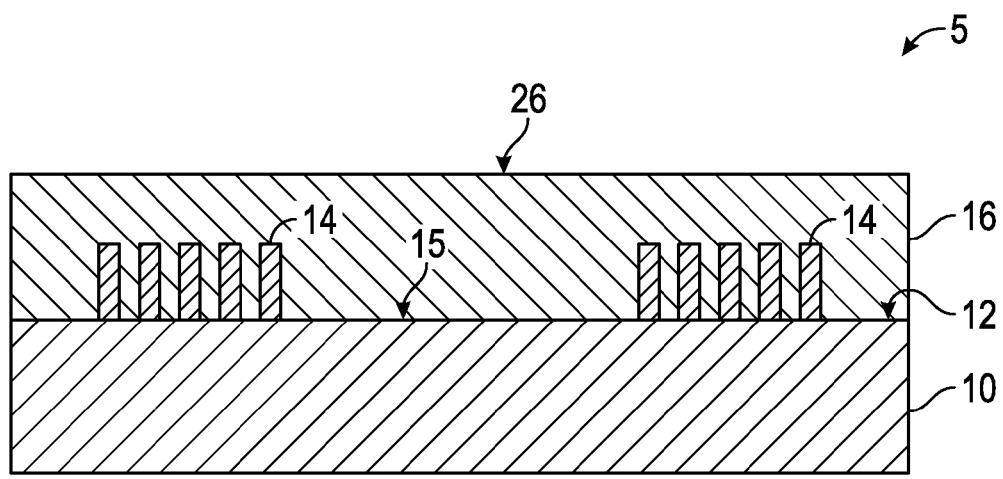

Referring to FIG. 4, planarization of the sacrificial layer and the raised portions may proceed until the sacrificial layer is substantially completely removed, thereby providing a planarized upper boundary 26 of the permanent layer 16 on an opposite side of the permanent layer 16 from the lower boundary 15. In this regard, because the sacrificial layer is conformally formed over the permanent layer 16, the sacrificial layer and the raised portions may be planarized onto substantially even plane with the sunken portions to form the planarized permanent layer 16 with minimized variation in surface planarity between the sunken portions and the raised portions. It is to be appreciated that planarization may still proceed even after the sacrificial layer is completely removed, although further planarization is optional and may result in unintended variation in surface planarity. Thus, in embodiments, CMP is designed to cease once the sacrificial layer is substantially completely removed. In embodiments, planarizing of the sacrificial layer and the raised portions of the permanent layer 16 onto substantially even plane with the sunken portions may provide a variation in surface topography in the permanent layer 16 of less than or equal to about 500 Å after CMP, such as less than or equal to about 100 Å or such as from about 25 to about 100 Å. Such variation in surface topography is not presently possible with conventional CMP techniques and represents minimized variation in surface planarity that enables robust FinFET devices to be prepared even as critical dimensions continue to decrease.

Although not shown in the Figures, it is to be appreciated that conventional FinFET fabrication may proceed after CMP of the permanent layer 16 which, in this embodiment, is the gate electrode structure 16. For example, conventional FEOL techniques such as source/drain formation may proceed, optionally followed by conventional BEOL techniques such as deposition of interlayer dielectric layers and selective etching/contact deposition to form electrical connections between various FinFET devices.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method of forming an integrated circuit with a planarized permanent layer, wherein the method comprises:
   providing a base substrate having an uneven surface topography;
   conformally forming a permanent layer over the base substrate, wherein the permanent layer comprises raised portions and sunken portions corresponding to the surface topography of the base substrate;
   conformally forming a sacrificial layer over the permanent layer;
   chemical-mechanical planarizing the sacrificial layer and the raised portions of the permanent layer to provide the planarized permanent layer, wherein the sacrificial layer is substantially completely removed after chemical-mechanical planarizing.

2. The method of claim 1, wherein chemical-mechanical planarizing comprises chemical-mechanical planarizing the sacrificial layer and the raised portions onto substantially even plane with the sunken portions to form the planarized permanent layer.

3. The method of claim 2, wherein chemical-mechanical planarizing the sacrificial layer and the raised portions onto substantially even plane with the sunken portions comprises chemical-mechanical planarizing the raised portions to a variation in surface topography in the permanent layer of less than or equal to about 500 Å after chemical-mechanical planarizing.

4. The method of claim 1, wherein providing the base substrate having the uneven surface topography comprises providing the base substrate comprising fins, wherein the fins comprise semiconductor material.

5. The method of claim 4, wherein conformally forming the permanent layer comprises conformally forming a gate electrode structure over the base substrate and the fins, wherein the raised portions are disposed over fins and the sunken portions are disposed over the base substrate outside of the fins.

6. The method of claim 5, wherein conformally forming the gate electrode structure over the base substrate and the fins comprises forming a gate electrode layer comprising semiconductor material.

7. The method of claim 5, wherein conformally forming the sacrificial layer comprises conformally forming the sacrificial layer having a thickness equal to or greater than a difference in height between the sunken portions and the raised portions of the permanent layer.

8. The method of claim 1, wherein conformally forming the sacrificial layer comprises conformally depositing material chosen from an oxide, a nitride, or spin on glass to form the sacrificial layer.

9. The method of claim 1, wherein conformally forming the sacrificial layer comprises conformally forming the sacrificial layer having a different chemical-mechanical planarization rate than the permanent layer.

10. The method of claim 9, wherein conformally forming the permanent layer comprises conformally forming the permanent layer comprising raised portions layer having a higher pattern density than the sunken portions.

11. The method of claim 10, wherein conformally forming the sacrificial layer comprises conformally forming the sacrificial layer having a higher chemical-mechanical planarization rate than the permanent layer.

12. The method of claim 9, wherein conformally forming the permanent layer comprises conformally forming the permanent layer comprising raised portions layer having a lower pattern density than the sunken portions.

13. The method of claim 12, wherein conformally forming the sacrificial layer comprises conformally forming the sacrificial layer having a lower chemical-mechanical planarization rate than the permanent layer.

14. The method of claim 1, wherein chemical-mechanical planarizing comprises chemical-mechanical planarizing in the absence of an etch-stop layer disposed under the sacrificial layer.

15. The method of claim 1, wherein planarization of the sacrificial layer and the raised portions proceeds until the sacrificial layer is substantially completely removed, and wherein planarization ceases once the sacrificial layer is substantially completely removed.

16. The method of claim 1, wherein a platen and slurry are employed to initially planarize the sacrificial layer, and wherein the same platen and slurry are employed to further planarize the sacrificial layer and the raised portions once the raised portions are exposed.

17. A method of forming a FinFET device, wherein the method comprises:
   providing a base substrate comprising fins, wherein the fins comprise semiconductor material;
   conformally forming a gate electrode structure over the base substrate and the fins, wherein the gate electrode structure comprises raised portions disposed over the fins and sunken portions disposed over the base substrate outside of the fins;
   conformally forming a sacrificial layer over the gate electrode structure, wherein the sacrificial layer has a different chemical-mechanical planarization rate than the gate electrode structure;
   chemical-mechanical planarizing the sacrificial layer and the raised portions of the gate electrode structure onto substantially even plane with the sunken portions of the gate electrode structure to form a planarized gate electrode structure.

18. The method of claim 17, wherein conformally forming the gate electrode structure comprises conformally forming a gate dielectric layer over the base substrate and the fins, and conformally forming a gate electrode over the gate dielectric layer.

19. The method of claim 18, wherein chemical-mechanical planarizing the raised portions of the gate electrode structure comprises chemical-mechanical planarizing the gate electrode with the gate dielectric remaining unplanarized.

* * * * *